United States Patent
Ye et al.

(10) Patent No.: US 11,012,101 B2
(45) Date of Patent: May 18, 2021

(54) DATA TRANSMISSION METHOD, APPARATUS AND STORAGE MEDIUM

(71) Applicant: NTT DoCoMo, Inc., Tokyo (JP)

(72) Inventors: Neng Ye, Beijing (CN); Xiangming Li, Beijing (CN); Xiaohang Chen, Beijing (CN); Xiaolin Hou, Beijing (CN)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 16/627,066

(22) PCT Filed: Apr. 4, 2018

(86) PCT No.: PCT/CN2018/081789
§ 371 (c)(1),
(2) Date: Dec. 27, 2019

(87) PCT Pub. No.: WO2019/001065
PCT Pub. Date: Jan. 3, 2019

(65) Prior Publication Data
US 2020/0228147 A1    Jul. 16, 2020

(30) Foreign Application Priority Data
Jun. 30, 2017    (CN) .......................... 201710522236.5

(51) Int. Cl.
*H03M 13/00* (2006.01)
*H03M 13/35* (2006.01)
(Continued)

(52) U.S. Cl.
CPC ........ *H03M 13/6337* (2013.01); *G06N 20/00* (2019.01); *H03M 13/353* (2013.01);
(Continued)

(58) Field of Classification Search
CPC .......................... H03M 13/6337; H03M 13/353
See application file for complete search history.

(56) References Cited

U.S. PATENT DOCUMENTS

| | | | | |
|---|---|---|---|---|
| 2003/0083090 A1* | 5/2003 | Huh | ...................... | H04W 52/54 455/522 |
| 2004/0095880 A1* | 5/2004 | Laroia | ................... | H04W 52/34 370/208 |

(Continued)

FOREIGN PATENT DOCUMENTS

| | | |
|---|---|---|
| CN | 101594223 A | 12/2009 |
| CN | 106105071 A | 11/2016 |
| WO | WO-2016069165 A1 | 5/2016 |

OTHER PUBLICATIONS

International Search Report (in English and Chinese) issued in International Application No. PCT/CN2018/081789, dted Jun. 28, 2019; ISA/CN.

*Primary Examiner* — Joseph D Torres (57) ABSTRACT

The present application provides a data transmission method which includes: obtaining statistical characteristics of interferences; determining a total number of coding layers of multi-layer coding and a code rate and transmitting power of each coding layer according to the statistical characteristics of the interferences; processing to-be-transmitted information bits through data re-organization according to the determined total number of coding layers of the multi-layer coding to obtain information bits of each coding layer; coding the information bits of each coding layer respectively according to the determined code rate of each coding layer to obtain a coded data stream of each coding layer; processing the coded data stream of each coding layer through layer mapping and modulation according to the determined transmitting power of each coding layer to obtain a symbol stream to be transmitted; and transmitting the symbol stream to be transmitted.

20 Claims, 3 Drawing Sheets

(51) Int. Cl.
*G06N 20/00* (2019.01)
*H03M 13/37* (2006.01)
*H03M 13/39* (2006.01)

(52) U.S. Cl.
CPC ....... *H03M 13/3715* (2013.01); *H03M 13/39* (2013.01); *H03M 13/635* (2013.01)

(56) References Cited

U.S. PATENT DOCUMENTS

| | | | | |
|---|---|---|---|---|
| 2004/0166887 | A1* | 8/2004 | Laroia | H04W 52/325 455/522 |
| 2006/0210001 | A1* | 9/2006 | Li | H04W 52/243 375/346 |
| 2007/0087772 | A1* | 4/2007 | Yi | H04B 17/354 455/522 |
| 2010/0067465 | A1* | 3/2010 | Miki | H04L 5/0037 370/329 |
| 2012/0287886 | A1* | 11/2012 | Fukuoka | H04L 5/003 370/329 |

\* cited by examiner

DATA TRANSMISSION METHOD, APPARATUS AND STORAGE MEDIUM

CROSS REFERENCE TO RELATED APPLICATIONS

This application is a 371 National Stage of International Application No. PCT/CN2018/081789, filed Apr. 4, 2018, which claims priority to Chinese patent application No. 201710522236.5, titled "data transmission method, apparatus and storage medium", and filed on Jun. 30, 2017 with China National Intellectual Property Administration. The entire disclosures of the above applications are incorporated herein by reference.

TECHNICAL FIELD

The present application relates to mobile communications, and particularly, to a data transmission method, apparatus and computer-readable storage medium in multi-user access technologies.

BACKGROUND

Non-orthogonal multiple access (NOMA) can remarkably improve the uplink and downlink transmission performances of cell edge users and system throughput. Further, a Grant-free contention-based mechanism proposed for uplink transmission can significantly reduce the access delay of users and signaling overheads. In the Grant-free contention-based mechanism, however, since not all interferences can be accurately known, it is one of the currently to-be-solved problems how to perform coding and modulation for data at the transmitting device to reduce inter-user interferences to optimize the transmission performances and throughput of the mobile communication systems.

SUMMARY

Embodiments of the present application provide a data transmission method. The method may include:
obtaining statistical characteristics of interferences;
determining a total number of coding layers of multi-layer coding and a code rate and transmitting power of each coding layer according to the statistical characteristics of the interferences;
processing to-be-transmitted information bits through data re-organization according to the determined total number of coding layers of the multi-layer coding to obtain information bits of each coding layer of the coding layers;
coding the information bits of each coding layer respectively according to the determined code rate of each coding layer to obtain a coded data stream of each coding layer;
processing the coded data stream of each coding layer through layer mapping and modulation according to the determined transmitting power of each coding layer to obtain a symbol stream to be transmitted; and
transmitting the symbol stream to be transmitted.

Embodiments of the present application also provide a data transmission apparatus. The data transmission apparatus may include:
a processor;
a memory coupled to the processor; the memory stores machine-readable instruction modules which include:
an interference determining module, to obtain statistical characteristics of interferences;
a multi-layer coding parameter determining module, to determine a total number of coding layers of multi-layer coding and a code rate and transmitting power of each coding layer according to the statistical characteristics of the interferences;
a data re-organizing module, to process to-be-transmitted information bits through data re-organization according to the determined total number of coding layers of the multi-layer coding to obtain information bits of each coding layer of the coding layers;
a multi-layer coding module, to code the information bits of each coding layer respectively according to the determined code rate of each coding layer to obtain a coded data stream of each coding layer;
a layer mapping module, to process the coded data stream of each coding layer through layer mapping and modulation according to the determined transmitting power of each coding layer to obtain a symbol stream to be transmitted; and
a transmitting module, to transmit the symbol stream to be transmitted.

In addition, embodiments of the present application also provide a computer-readable storage medium storing computer instructions executable by a processor to implement the steps of the above-mentioned method.

According to the scheme of the present application, a transmitting device can perform data coding and modulation using statistical characteristics of interferences without accurate knowledge of all of the interferences. As such, the data transmission method is applicable to scenarios where the transmitting device is unable to obtain accurate knowledge of all interferences, for example, in an uplink transmission mode based on the Grant-free contention-based mechanism, or scenarios in other contention-based data transmission modes, uncoordinated transmission modes, or scenarios with channel estimation errors, channel estimation delays (i.e., channel aging), or the like.

In addition, in the above method of the present application, a transmitting device uses a multi-layer coding structure to adapt to the statistical characteristics of interferences, i.e., to adapt to the interferences through joint power and code rate allocations in multi-layer coding, so as to reduce the outage probability and/or to increase the average data rate. That is, better data transmission performances can be achieved by using the data transmission method of the present application.

BRIEF DESCRIPTION OF THE DRAWINGS

In order to make the technical scheme of embodiments of the present application clearer, the following is a brief introduction of the drawings used in description of the embodiments. Obviously, the following drawings are merely some of the embodiments, and based on which other drawings can be obtained by those skilled in the art without any inventive work done.

DETAILED DESCRIPTION

Technical schemes provided by embodiments of the present application are hereinafter described clearly and completely in detail with reference to the accompanying drawings. It should be understood that the embodiments described are merely some embodiments of the present application, not all of the embodiments. Based on the embodiments of the present application, other embodiments obtained by those skilled in the art without any inventive work done are still within the protection scope of the present application.

For simplicity and illustrative purposes, the present application is described by referring mainly to some typical examples thereof. The lots of details in the embodiments are provided merely for facilitating thorough understanding of the present application. Apparently, the present application can be practiced without being limited by those details. For some embodiments, only the framework is described without specific details so as not to unnecessarily obscure the present application. As used herein, the term "include . . . " means "include but not limited to . . . ", the term "according to . . . " means "according at least in part to . . . ". Quantities of an element, unless explicitly specified, may be one or a plurality of, or at least one.

The present application provides a data transmission method which, when accurate knowledge about all interferences cannot be obtained, can perform data coding, modulation and transmission according to incomplete information of the interferences (such as statistical characteristics of the interferences), thus can greatly reduce inter-user interference.

Figure 1:
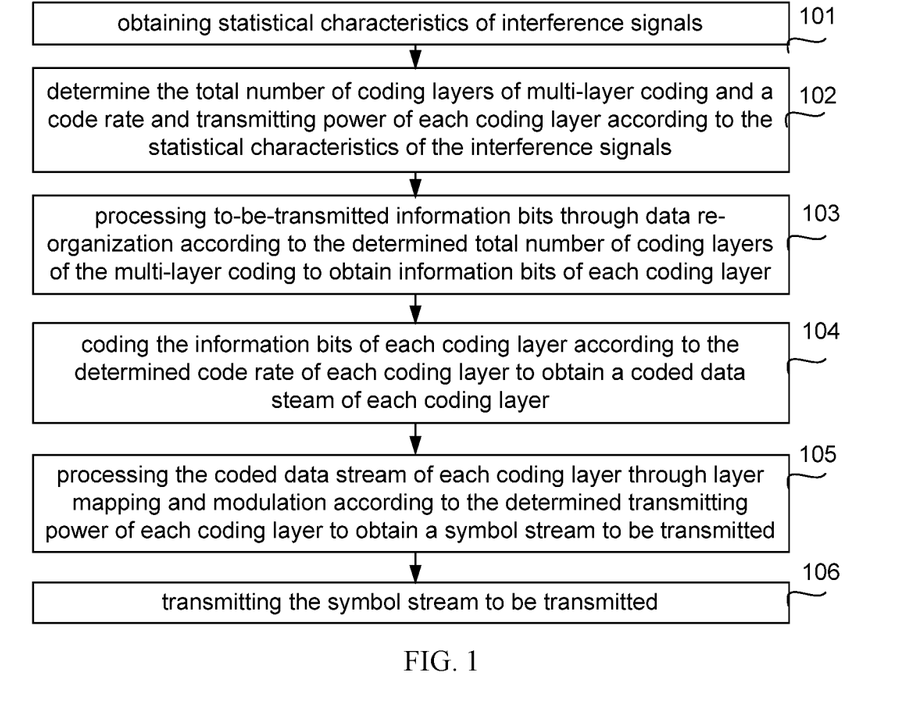
FIG. 1 is a flowchart illustrating a data transmission method according to an example of the present application.

FIG. 1 is a flowchart illustrating a data transmission method according to an example of the present application. The method may be executed by a transmitting device. Specifically, for uplink transmission, the transmitting device is user equipment (UE); for downlink transmission, the transmitting device is a base station eNB. As shown in FIG. 1, the method may include the following procedures.

Step 101: Obtain statistical characteristics of interferences.

In some examples of the present application, the above statistical characteristics of the interferences may specifically refer to the statistical distribution of the interferences in a channel. In addition, the method of obtaining the statistical characteristics of the interferences will be described in detail hereinafter.

Step 102: Determine the total number of coding layers of multi-layer coding and a code rate and transmitting power of each of the coding layers according to the statistical characteristics of interferences.

In some examples of the present application, the transmitting device may code and modulate the to-be-transmitted data using a multi-layer coding (MLC) method. Further, in some examples of the application, the total number of layers of the multi-layer coding, the code rate and the transmitting power of each coding layer are all determined according to the statistical characteristics of the interferences so as to adapt to the statistical characteristics of the interferences, thereby data transmission performances can be improved and the influence of the interferences on the data transmission can be reduced.

In addition, the method of determining the total number of coding layers of multi-layer coding and the code rate and the transmitting power of each coding layer according to the statistical characteristics of interferences is described in detail hereinafter.

Step 103: Process the to-be-transmitted information bits through data re-organization according to the determined total number of coding layers of the multi-layer coding to obtain information bits of each coding layer of the coding layers.

In some examples of the present application, after the total number of coding layers in the multi-layer coding is determined, the transmitting device can perform data re-organization on the information bits to be transmitted, and divide the information bits into a plurality of groups. Each of the groups is corresponding to one of the coding layers respectively for using in respective subsequent coding and modulation. Specifically, details of the data re-organization are described in detail hereinafter.

Step 104: Code the information bits of each coding layer respectively according to the determined code rate of each coding layer to obtain a coded data stream of each coding layer.

In some examples of the present application, after obtaining the information bits of each coding layer and the code rate of each coding layer, the transmitting device can code the information bits of each coding layer respectively in the same manner as in the single-layer coding (SLC) to obtain the coded data stream of each coding layer.

Step 105: Process the coded data stream of each coding layer through layer mapping and modulation according to the determined transmitting power of each coding layer to obtain a symbol stream to be transmitted.

In some examples of the present application, the transmitting device may combine the coded data streams of the coding layers of the multi-layer coding into one data stream and modulate the data stream onto a plurality of constellation symbols through constellation modulation before transmitting the data using a transmitter of the transmitting device. The above procedure of combining the data streams of the coding layers of the multi-layer coding into one data stream may generally be referred to as layer mapping, which is generally based on the transmitting power of the coding layers.

Specifically, the transmitting device may perform layer mapping before constellation modulation, or perform constellation modulation before layer mapping. The implementation method is described in detail hereinafter.

Step 106: Transmit the symbol stream to be transmitted.

After the ultimate coded and modulated symbol stream is obtained, the transmitting device may transmit the above-mentioned symbol stream using a transmitter of the transmitting device to complete the data transmission.

According to the above method, a transmitting device of the present application can perform data coding and modulation using the statistical characteristics of interferences without accurate knowledge about all of the interferences. As such, the data transmission method is applicable to scenarios where the transmitting device is unable to obtain accurate knowledge about all of interferences, for example, in an uplink transmission mode based on a Grant-free contention-based mechanism, or scenarios in other contention-based data transmission modes, uncoordinated transmission modes, or scenarios with channel estimation errors, channel estimation delays, or the like.

In addition, in the above method of the present application, a transmitting device uses a multi-layer coding structure to adapt to the statistical characteristics of interferences, i.e., to adapt to the interferences through joint power and code rate allocations in multi-layer coding, so as to reduce the outage probability and/or to increase the average data rate. That is, better data transmission performances can be achieved by using the data transmission method of the present application.

In addition, in order to enable a receiving device to correctly demodulate and decode symbols transmitted by the transmitting device, the transmitting device may further feed back the following information to the receiving end through uplink signaling or downlink signaling: the total number of coding layers in the multi-layer coding, the code rate and the transmitting power of each coding layer, or the like.

Methods of implementing the various steps in the above methods are described in further detail below with reference to specific examples and drawings.

With respect to the above step 101, it is described in below, by way of example, details about how the transmitting device obtains the statistical characteristics of the interferences.

As mentioned above, in some examples of the present application, the above statistical characteristics of the interferences may specifically refer to the statistical distribution of the interferences in a channel.

As such, in examples of the present application, the transmitting device may obtain the statistical characteristics of the interferences through the following three methods.

Method 1: The transmitting device estimates the statistical characteristics of the interferences using already-known information about the channel.

In this example, the information about the channel may be the channel quality index (CQI). The transmitting device may predetermine a statistical distribution model of the interferences in the channel, and then estimate the statistical characteristics of the interferences according to the information about the channel (such as CQI) and the predetermined statistical distribution model of the interferences in the channel. The statistical distribution model of the interferences in the channel may be a priori knowledge or an assumption about the statistical distribution of interferences in the channel. For example, when there are a large number of users and the traffic of each user is assumed to conform to Poisson distribution, the average interference power may be assumed to conform to the Gaussian distribution. The statistical characteristics of the interferences may be, for example, a distribution function of the average interference power, the average value of the average interference power, etc.

In some examples of the present application, an assumed distribution model of an average value of the interference may be pre-defined, e.g., it may be assumed that the average value of the interference in the channel conform to Gaussian distribution or uniform distribution, and an instantaneous CQI may be determined to be the average value of the statistical distribution of the average value of the channel interference. As such, the statistical distribution of the average value of the interferences, i.e. the statistical characteristics of the interferences, can be determined according to the instantaneous CQI.

In some examples of the present application, the statistical distribution model of the interferences in the channel may be pre-defined, in which an interference distribution function may be determined by one or several parameters. Some or all of the parameters are in a one-to-one correspondence with the CQI. As such, after obtaining the knowledge about the CQI, the transmitting device may put the CQI into the interference distribution function in the above model to obtain a distribution function of the interferences. Specifically, the above statistical distribution model of the interferences in the channel may be a Gaussian distribution model, a Poisson distribution model, a Pareto distribution model, etc.

Method 2: The statistical characteristics of the interferences are obtained by analyzing the distribution characteristics of the interferences.

In this method, especially in a massive machine type of communication (mMTC) system, the data arrival rate of each device and the number of devices may be pre-assumed, and the statistical distribution of interferences may be obtained based on analysis using the law of large numbers, i.e., the statistical characteristics of the interferences can be determined. Specifically, the probability density distribution of the total number of users simultaneously performing transmission in the channel and the overall transmitting power in the channel may be analyzed based on a traffic model, a transmission power model and a position distribution model of the users and according to the law of large numbers, to obtain the statistical characteristics of the interferences, that is, the statistical characteristics of the interferences can be obtained according to the number and positions of the users.

Method 3: The statistical characteristics of interferences are estimated through Online Learning.

It should be noted that Online Learning is a machine learning algorithm commonly used in industry and can be regarded as a method of training models. Specifically, Online Learning can quickly adjust the model in real time according to online feedback data, so as to enable the model to timely reflect the changes in online data, thereby improve the online prediction accuracy. Based on that, the transmitting device may establish a machine learning model which takes the instantaneous interferences obtained each time as the input and takes the statistical distribution of the interferences as the output. Thereafter, the transmitting device may continuously update the machine learning model according to the instantaneous interferences, and the statistical characteristics of the interferences may be obtained when the output of the machine learning model converges.

In an example of the present application, based on the machine learning method of Online Learning, the transmitting device may obtain and continuously update the statistical distributions of the interferences in the channel during operation, and when a learning result converges, the statistical distribution of the interferences can be determined, that is, the statistical characteristics of the interferences can be determined.

Specifically, the transmitting device may select a machine learning model, e.g., a Reinforcement Learning model, the input of the model is the instantaneous interferences obtained each time, and the output of the model is the statistical distributions or other statistical characteristics of the interferences. In this way, the transmitting device may continuously update the statistical distribution of the interferences during operation to determine the statistical characteristics of the interferences. In addition, the above machine learning model may also be deployed at the receiving device (e.g., in uplink transmission, the machine learning model is deployed in a device at the base station side).

In this situation, the receiving device may determine the statistical characteristics of the interferences using the same machine learning method as described above, and then notify the transmitting device through related signaling, such as broadcast signaling.

It can be seen that the statistical distribution of the interference of the channel, i.e. the statistical characteristics of the interferences, can be obtained at the transmitting device through various methods as described above.

With respect to the above step 102, described below is an example of a detailed method of the transmitting device determining the total number of coding layers of the multi-layer coding and the code rate and transmitting power of each coding layer according to the statistical characteristics of the interferences.

According to examples of the present application, the transmitting device can optimize the total number of coding layers of the multi-layer coding, the code rate and the transmitting power of each coding layer to adapt them to the statistical characteristics of the interferences, which ultimately maximizes the average transmission data rate of the transmitting device. Therefore, in embodiments of the present application, the optimization in step 102 is to identify the total number of coding layers of the multi-layer coding and the code rate and transmitting power of each coding layer that can maximize the average transmission data rate of the transmitting device given the statistical distribution of the interferences.

Figure 2:
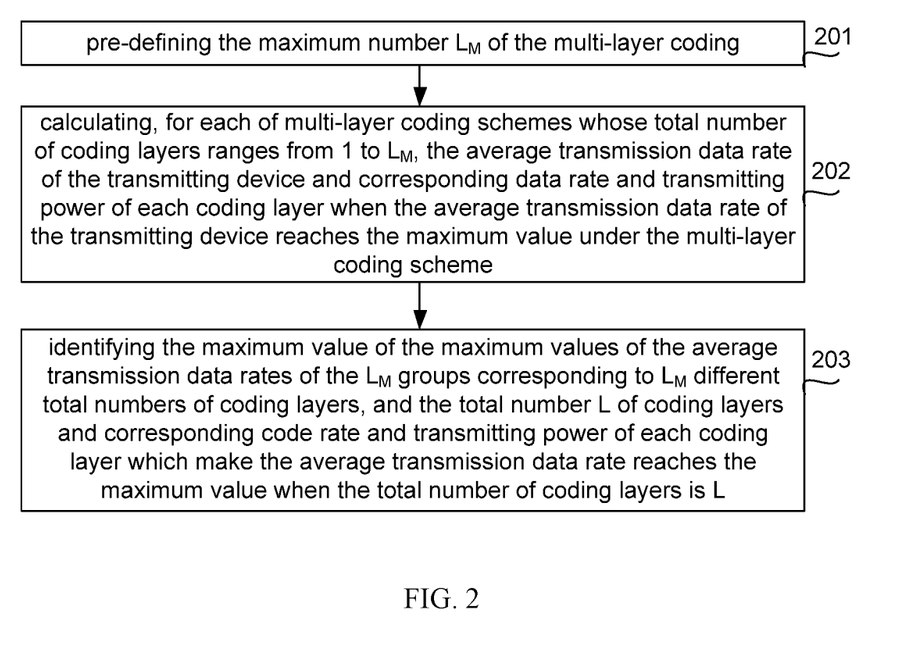
FIG. 2 is a flowchart illustrating a method of a transmitting device determining the total number of coding layers of multi-layer coding and a code rate and power of each coding layer according to statistical characteristics of interferences according to an example of the present application.

In an example of the present application, FIG. 2 is a flowchart illustrating a method of determining the total number of coding layers of the multi-layer coding and the code rate and transmitting power of each coding layer according to the statistical characteristics of the interferences. As shown in FIG. 2, the method may specifically include the following procedures.

Step 201: Pre-define the maximum number $L_M$ of coding layers of multi-layer coding.

In theory, the more the coding layers of the multi-layer coding are, the better the transmitting device can adapt to the interference characteristics, thereby the average data transmission rate of the transmitting device can be increased by a greater extent. Accordingly, the more the coding layers of the multi-layer coding are, however, the greater the complexity of the transmitting device is. Thus, the maximum number $L_M$ of the coding layers of the multi-layer coding may be defined as the upper bound of the total number of coding layers, and the maximum number $L_M$ of the coding layers of the multi-layer coding may be defined by taking into consideration the tradeoff between performances and complexity, e.g., can be defined according to experiences, etc. For example, in some examples, the above maximum number $L_M$ of the coding layers of the multi-layer coding may be defined as 3.

Step 202: Calculate, respectively for each of multi-layer coding scheme whose total number of coding layers ranges from 1 to the maximum number $L_M$, the average transmission data rate of the transmitting device and the code rate and transmitting power of each coding layer when the average transmission data rate of the transmitting device reaches the maximum value under that multi-layer coding scheme.

That is, the calculations in the step 202 may generate $L_M$ groups of maximum values of the average transmission data rates of the transmitting device corresponding to different total numbers of coding layers of the multi-layer coding and corresponding code rates and transmitting power of each coding layer. For example, when $L_M$ is 3, the following items can be obtained through the steps described above: for the multi-layer coding with 1 coding layer, the code rate and transmitting power of the coding layer and the maximum value of the average transmission data rate of the transmitting device; for the multi-layer coding with 2 coding layers, respective code rates and transmitting power of the two coding layers and the maximum value of the average transmission data rate of the transmitting device; and for the multi-layer coding with 3 coding layers, respective code rates and transmitting power of the three coding layers and the maximum value of the average transmission data rate of the transmitting device.

In some examples of the present application, preferred code rates and power parameters of the multi-layer coding may be obtained by optimizing the following expression:

$$\max_{\lambda_i, R_i, i=1\ldots L} \int M\left(I, \lambda_i, R_i, i = 1 \ldots L, Rx\right) f(I) dI \tag{1}$$

wherein I is the average power of interferences, f(I) is the statistical distribution of the average power of the interferences; M(I, $\lambda_i$, $R_i$, i=1 . . . L, Rx) is a revenue function, in which $\lambda_i$ is a power allocation factor of the i-th coding layer, $R_i$ is the code rate of the i-th coding layer, M (I, $\lambda_i$, $R_i$, i=1 . . . L, Rx) is defined as the revenue obtained when the coding layers adopt the transmitting power allocation factor $\lambda_i$ and the code rate configuration $R_i$ given a certain reception strategy Rx and interference I, the revenue may be the ergodic capacity, or (1-outage probability), or the instantaneous capacity, or the like.

For example, in some examples of the present application, when the reception strategy Rx is determined to be performing SIC reception for each coding layer and the revenue target is determined to be the instantaneous capacity of reliable data transmission of the transmitting device, the revenue function may be defined as:

$$M(I, \lambda_i, R_i, i=1 \ldots L) = \Sigma_{i=1}^{L}(\Theta(\log(1+(P^*|\lambda_i|^2/N+I+P^*\Sigma_{j=i+1}^{L}|\lambda_i|^2)) > R_i)^*R_i) \tag{2}$$

wherein L is the total number of coding layers of the multi-layer coding; $\Sigma_{i=1}^{L}|\lambda_i|^2=1$; P is transmitting power of the transmitting device; and N is the transmitting power of noise. When optimizing the above expression, it is assumed that the i-th layer is detected before the j-th layer by the receiving device, i.e. (i<j). In addition, $\Theta(\cdot)$ is a characteristic function, e.g., when the expression in the parentheses is true, the value of the function is 1, and otherwise, the value is 0.

It should be noted that, in the above optimization process, the selection of the values of various parameters (including the code rate, the transmitting power factor, etc.) may be under certain restrictions. In some examples of the present application, the restrictions may be the result of candidate configurations of the encoder, of candidate configurations of the modulator, or of constraints of the shape of the ultimate composite constellation, etc. Therefore, during the optimization process, the above equation (1) may be optimized according to conditions such as candidate configurations of the encoder and the modulator of the system, constraints of the shape of a constellation or the like, to obtain the maximum value of the average transmission data rate of the transmitting device under the system constraints.

By maximizing the above expression (1), the code rate and the transmitting power of each coding layer required to make the average transmission data rate of the transmitting device reach the maximum value for multi-layer coding with L coding layers can be obtained.

In some examples of the present application, $L_M$ groups of data as shown in Table 1 below can be obtained through the above step 202:

TABLE 1

| Number of layers of multi-layer coding | Maximum average transmission data rate of transmitting device | Code rate of each coding layer | Transmitting power of each coding layer |
|---|---|---|---|
| 1 | C1 | {R1} | {P1} |
| 2 | C2 | {R2} | {P2} |
| ... | ... | ... | ... |
| $L_M$ | $CL_M$ | {$RL_M$} | {$PL_M$} |

In the above table, each of data {RL} and {PL} in the L-th row ($1 \leq L \leq L_M$) is an array with L elements respectively, L is the total number of elements in the array, i.e., {RL} consists of the code rates of coding layers from the first coding layer to the L-th coding layer; and {PL} consists of the transmitting power or power allocation factors of coding layers from the first coding layer to the L-th coding layer.

Step 203: Identify the maximum value of the maximum values of the average transmission data rates of the transmitting device of the $L_M$ groups corresponding to $L_M$ different numbers of coding layers, the number L of coding layers corresponding to the maximum value and corresponding code rate and transmitting power of each coding layer which generate the maximum average transmission data rate of the transmitting device when the total number of coding layers of the multi-layer coding is L.

As described above, through the above step 202, the data as shown in the above Table 1 can be obtained. In this step, the maximum value of the maximum values of the $L_M$ average transmission data rates of the transmitting device, i.e., the maximum value of C1~$CL_M$, e.g., CL, can first be identified from the $L_M$ groups of data, and the total number of coding layers of the multi-layer coding can be determined to be L. Then, according to the L-th group of data in the above table, the code rate and transmitting power of each coding layer when the total number of coding layers of the multi-layer coding is L and the average transmission data rate reaches the maximum value can be identified, i.e., the data {RL} and {PL} in the L-th row of the above Table 1 are taken as the code rate and the transmitting power of each coding layer in the multi-layer coding of L layers.

As can be seen from the above method of selecting the total number of coding layers of the multi-layer coding, the code rate and the transmitting power of each coding layer, the selecting method aims at maximizing the average transmission data rate of the transmitting device, i.e., the determined number of coding layers of the multi-layer coding, the code rate and the transmitting power of each coding layer can make signals transmitted by the user better adapted to the interferences in the channel, such that the average transmission data rate of the transmitting device can reach the maximum value; and when the SIC reception among multiple users is considered, the determined number of coding layers of the multi-layer coding, and the code rate and the transmitting power of each coding layer can promote the SIC among the multiple users, so as to remove some of inter-user interferences and increase the overall capacity.

It should be noted that according to the present application, besides maximizing the average transmission data rate of the transmitting device, other optimization targets may be selected to determine the total number of coding layers of the multi-layer coding and corresponding code rate and transmitting power of each coding layer. For example, the optimization target may be selected to be minimizing the outage probability, or the Shannon capacity expression in the previous example may be replaced with an expression for the capacity of a constrained constellation, and the selection of the optimization target is not limited in the present application.

Although the optimization target is not strictly limited in the present application, the selected optimization targets in the present application should all be related to the total number of coding layers of the multi-layer coding and corresponding code rate and transmitting power of each coding layer, and the optimization target can be achieved by selecting a proper total number of coding layers for the multi-layer coding and selecting a proper code rate and proper transmitting power for each coding layer, so as to determine the above-mentioned parameters involved in the present application, namely the total number of coding layers of the multi-layer coding and corresponding code rate and transmitting power of each coding layer.

With respect to the above step 103, described below is a detailed example of a method of the transmitting device processes the to-be-transmitted information bits through the data re-organization according to the determined total number of coding layers of the multi-layer coding.

Figure 3:
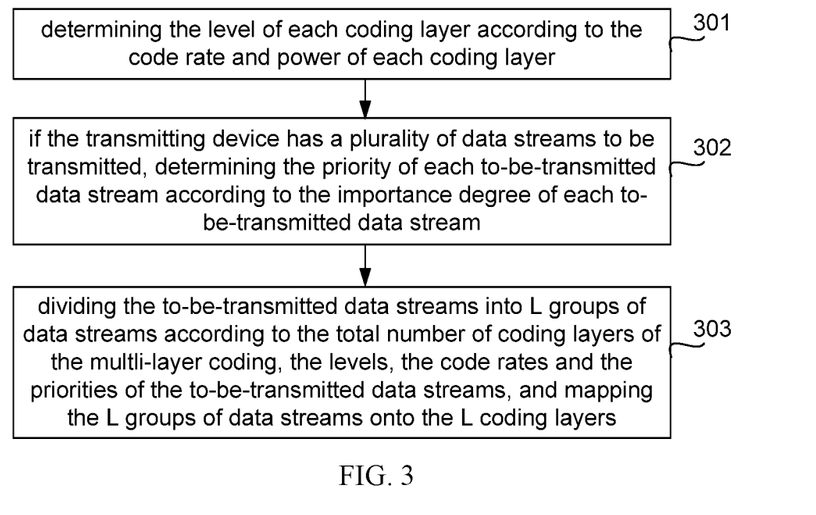
FIG. 3 is a flowchart illustrating a data re-organizing method at a transmitting device according to an example of the present application.

Specifically, FIG. 3 is a flowchart illustrating a data re-organizing method according to an example of the present application. As shown in FIG. 3, after the total number of coding layers of the multi-layer coding and corresponding code rate and transmitting power of each coding layer are determined, the transmitting device may perform the following procedures.

Step 301: Determine the level of each coding layer.

Since different coding layers may be corresponding to different code rates and different transmitting power, the protection strengths provided by different coding layers to respective information bits are different, that is, different coding layers in the multi-layer coding may provide differentiated error-tolerance protections (i.e., reliabilities) for the information bits. Generally, assuming that all the other settings are the same, the error-tolerant protection level (i.e., reliability level) of the i-th layer is regarded as higher than that of the j-th layer when a codeword detection success rate of the i-th coding layer is higher than the success rate of the j-th coding layer. In addition, the above estimation can be performed by the transmitting device, therefore, the error-tolerance protection level of each coding layer may be estimated after the total number of coding layers of the multi-layer coding and corresponding code rate and power of each coding layer are determined. For example, it can be determined that the lower the code rate and the higher the transmitting power of a coding layer are, the higher the error-tolerance protection level of the coding layer is. In the present application, the error-tolerance protection level of a coding layer may be simply referred to as the level of the coding layer for facilitating description.

Step 302: When there are a plurality of data streams to be transmitted at the transmitting device, the priorities of the to-be-transmitted data streams are determined according to the importance degrees of the to-be-transmitted data streams.

Generally, the data to be transmitted by a transmitting device may include a variety of types of data, and some data is more important than others, e.g., control information (e.g., the UE identification (ID) or modulation and coding strategy (MCS) settings, etc.) is generally more important than data information, and emergency information is generally more important than regular information. Therefore, in this step, the priorities of the to-be-transmitted data streams may be determined according to the importance degrees of the plurality of data streams to be transmitted by a user, and generally, the higher the importance degree of a data stream is, the higher the priority of the data stream is.

Step 303: Divide the to-be-transmitted data streams into L data stream groups according to the total number of coding layers of the multi-layer coding, the levels, the code rates, and the priorities of the data streams to be transmitted, and map the L data stream groups to the L coding layers, wherein L is the determined total number of coding layers of the multi-layer coding.

Further, in an example of the present application, a data stream group with a higher priority may be mapped to a coding layer of a higher level. Specifically, a to-be-transmitted data stream with a higher priority may first be grouped and mapped to one or multiple coding layers with a higher level, and then a to-be-transmitted data stream with a lower priority may be grouped and mapped to a coding layer with a lower level, so as to map data stream groups with higher priorities to coding layers with higher levels.

Further, during the data re-organization, the size of each data stream group may be determined by the code rate and the size of code blocks (i.e., resource blocks) of the coding layer.

Through the above method, data groupings can be performed according to the importance degrees of the to-be-transmitted data, to have important data grouped onto a coding layer with a higher error-tolerance protection level and be transmitted using resources with a higher priority, thereby the data transmission quality of important data can further be ensured.

With respect to the above step 105, as previously described, the transmitting device may perform layer mapping before modulation, or may perform modulation before layer mapping. The following describes examples of the method of the transmitting device applies layer mapping and modulation to the coded data stream of each coding layer according to the determined transmitting power of each coding layer to obtain the symbol stream to be transmitted.

Solution 1: Modulation before layer mapping.

In some examples of the present application, after coding the to-be-transmitted data stream of each coding layer to obtain the coded data stream of each coding layer, constellation modulation can be applied to the coded data stream of each coding layer respectively to obtain the to-be-transmitted symbol stream of each coding layer. Then, the transmitting device may perform layer mapping according to the transmitting power of each coding layer, allocate power for the to-be-transmitted symbols of each coding layer respectively, and combine the symbols into one symbol stream.

For example, in some examples of the present application, the layer mapping may be performed according to the following equation (3):

$$x^t = \sum_{l=1}^{L} \lambda_l^t x_l^t e^{j\vartheta_l^t}, x^t \in \chi^t(\lambda^t, \vartheta^t) \quad (3)$$

wherein $x_l^t$ is the modulated l-th symbol stream; $\lambda_l^t$ is the transmitting power allocation factor of the l-th coding layer; $\vartheta_l^t$ is the rotation angle of the constellation of the l-th coding layer; and $\chi^t(\lambda^t, \vartheta^t)$ represents a composite constellation of the receiving device determined using the parameter configuration in the parentheses.

In some examples, the rotation angle $\vartheta_l^t$ may be determined by finding the extreme value by equations (4) and (5) below.

$$\arg\max(\text{metric}(\vartheta^t)) \quad (4)$$

In the formula, $$\text{metric}(\vartheta^t) = \sum_{x_1 \in \chi^t(\lambda^t, \vartheta^t)} \log \left[ \sum_{x_2 \in \chi^t(\lambda^t, \vartheta^t)} \frac{1}{|\chi^t(\lambda^t, \vartheta^t)|^2} \exp\left(-\frac{1}{4\sigma^2} \|x_1 - x_2\|^2\right) \right] \quad (5)$$

wherein $x_1$ is a certain point in the composite constellation of the receiving device; $x_2$ is a certain point in the composite constellation of the receiving device; and $\sigma^2$ represents the noise variance.

In other examples, the default value of the rotation angle $\vartheta_l^t$ may be set as zero to reduce the complexity of the transmitting device.

Solution 2: Layer mapping before modulation.

In some examples of the present application, after the to-be-transmitted data stream of each coding layer is coded to obtain the coded data stream of each coding layer, a high-order constellation may be designed firstly according to the transmitting power of each coding layer, in which each constellation symbol is corresponding to a group of joint bit sequences of a plurality of coding layers. The plurality of coding layers may directly map the bits jointly onto a constellation symbol in the high-order constellation. Then, the transmitting device may perform high-order constellation modulation to obtain an ultimate to-be-transmitted symbol stream. In some examples, instead of designing the constellation based on the transmitting power, a fixed high-order constellation, e.g., 64QAM, 128QAM, etc., may be used, and a data stream with a higher priority may further be mapped to the bits of a constellation symbol with a higher protection level.

After the above processing, the transmitting device can obtain the to-be-transmitted symbol stream and transmit the symbol stream to the receiving device through a transmitter of the transmitting device.

Figure 4:
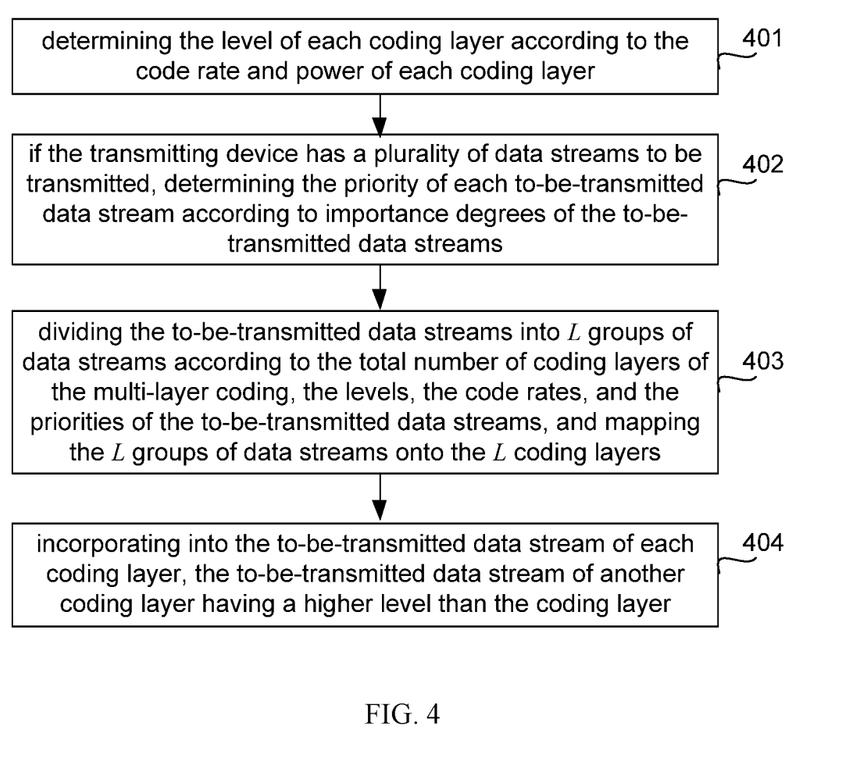
FIG. 4 is a flowchart illustrating a data re-organizing method at a transmitting device according to an example of the present application.

Generally, the receiving device may demodulate and decode the received data using a serial interference cancellation (SIC) method. The error propagation problem may occur, however, during reconstruction of the received signal through SIC at the receiving device. That is, when a wrong decision is made by the receiving device at a previous coding layer, the influence of the wrong decision may be propagated to the next coding layer after reconstruction and cancellation of the previous coding layer, which in turn influences the demodulation and decoding of the next coding layer, and even influences the system reliability in severe cases. Therefore, in order to prevent the error propagation at the receiving device, an example of the present application also provides a data re-organization method, which can be performed on the basis of the above data re-organization method of the present application, to effectively prevent the error propagation at the receiving device.

As shown in FIG. 4, the method may include the following procedures.

Step 401: Determine the level of each coding layer according to the code rate and the transmitting power of each coding layer.

Details of step 401 are similar to those of step 301 described above.

Step 402: When there are a plurality of data streams to be transmitted at the transmitting device, the priorities of the to-be-transmitted data streams may be determined according to the importance degrees of the to-be-transmitted data streams.

Details of step 402 are similar to those of step 302 described above.

Step 403: Divide the to-be-transmitted data streams into L data stream groups according to the total number of coding layers of the multi-layer coding, the levels, the code rates, and the priorities of the data streams to be transmitted, and map the L data stream groups to the L coding layers, wherein L is the determined total number of coding layers of the multi-layer coding.

Details of step 403 are similar to those of step 303 described above.

Step 404: For each coding layer, incorporate the to-be-transmitted data stream of another coding layer with a higher level than the coding layer into the to-be-transmitted data stream of the coding layer, and perform systematic coding.

That is, it is assumed that the 1st to the L-th coding layers are arranged in a descending order of levels. As such, in this step, for the i-th coding layer, the to-be-transmitted data streams of the 1st to the (i−1)-th coding layers may all be incorporated into the data streams of the i-th coding layer. That is, through the above processing, the to-be-transmitted data of any coding layer may include the to-be-transmitted data streams of all of the coding layers whose levels are higher than the level of the coding layer.

After the above data re-organization, the transmitting device may be restricted to use a systematic coding mode for coding. The main purpose of adopting the systematic coding is to reduce the interference of a subsequent coding layer to the previous coding layer, so that the symbols corresponding to each coding layer in the ultimate mixed (e.g., superposed) signals are not interfered by another coding layer having a lower level than the coding layer, i.e., the symbols corresponding to the first coding layer are free of inter-layer interference. Thus, according to the SIC operations, after information of coding layers on one level is obtained from successful decoding, the information can be removed as interference, the decoding process is continued to obtain the information of coding layers on the next level which does not include the interference from coding layers from lower levels and thus can be accurately decoded. Therefore, through the above method, after the transmitting power allocations are determined, the detection accuracy of coding layers with higher protection degrees at the receiving device can be greatly improved.

Figure 5:
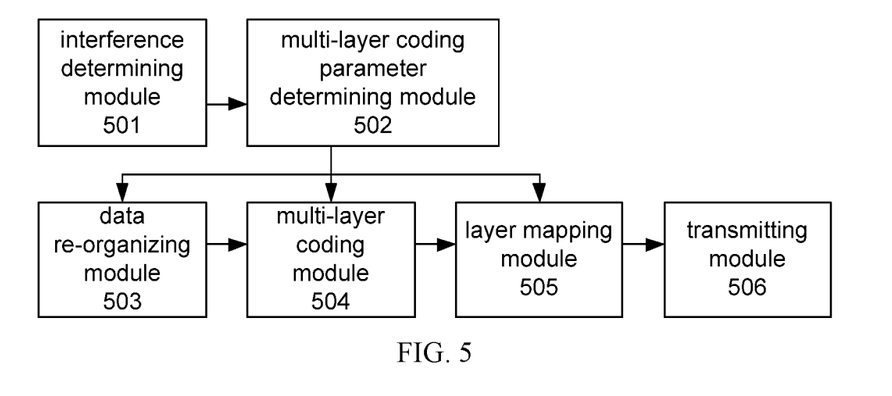
FIG. 5 is a schematic diagram illustrating the structure of a transmitting device according to an example of the present application.

Corresponding to the above method, embodiments of the present application also provide a data transmission apparatus. FIG. 5 is a schematic diagram illustrating the inner structure of a data transmission apparatus according to an example of the present application. As shown in FIG. 5, the data transmission apparatus may include the following components.

An interference determining module 501 may obtain statistical characteristics of interferences.

A multi-layer coding parameter determining module 502 may determine the total number of coding layers of multi-layer coding and a code rate and transmitting power of each coding layer according to the statistical characteristics of the interferences.

A data re-organizing module 503 may process to-be-transmitted information bits through data re-organization according to the determined total number of coding layers of the multi-layer coding to obtain information bits of each coding layer of the coding layers.

A multi-layer coding module 504 may encode the information bits of each coding layer respectively according to the determined code rate of each coding layer to obtain a coded data stream of each coding layer.

A layer mapping module 505 may process the coded data stream of each coding layer through layer mapping and modulation according to the determined transmitting power of each coding layer to obtain a symbol stream to be transmitted.

A transmitting module 506 may transmit the symbol stream to be transmitted.

In some examples of the present application, the multi-layer coding parameter determining module 502 may include:

a parameter setting unit, to pre-define the maximum number $L_M$ of coding layers of the multi-layer coding;

an optimizing unit, to calculate, for each multi-layer coding scheme whose total number of coding layers ranges from 1 to the maximum layer number $L_M$, the average transmission data rate of the transmitting device and corresponding code rate and transmitting power of each coding layer when the average transmission data rate of the transmitting device reaches the maximum value under that multi-layer coding scheme, to obtain $L_M$ groups of maximum values of the average transmission data rates of the transmitting device and corresponding code rate and transmitting power of each coding layer; and a selecting unit, to identify the maximum value from the $L_M$ groups of maximum values of the average transmission data rates of the transmitting device and corresponding code rate and transmitting power of each coding layer, determine a total number L of coding layers corresponding to the maximum value as the total number of coding layers of the multi-layer coding, and determine the code rate {RL} and transmitting power {PL} of each coding layer which make the average transmission data rate of the transmitting device reach the maximum value when the total number of coding layers of the multi-layer coding is L as the code rate and transmitting power of each coding layer of the multi-layer coding.

In some examples of the present application, the data re-organizing module 503 may include:

a coding layer level determining unit, to determine the levels of the L coding layers;

a data priority determining unit, to determine priorities of to-be-transmitted data streams according to the importance degrees of the to-be-transmitted data streams; and a mapping unit, to divide the to-be-transmitted data streams into L data stream groups according to the total number of coding layers of the multi-layer coding, levels, code rates and the priorities of the to-be-transmitted data streams, and map the L data stream groups to the L coding layers.

In some examples, after mapping the L data stream groups to the L coding layers, the mapping unit may further incorporate into the to-be-transmitted data stream of each coding layer a to-be-transmitted data stream of another coding layer with a higher level than the coding layer. In such case, the multi-layer coding module performs systematic coding for each coding layer.

In some examples of the present application, the layer mapping module 504 may include:

a modulating unit, to process the coded data stream of each coding layer through constellation modulation to obtain a to-be-transmitted symbol stream of each coding layer; and a layer mapping unit, to perform layer mapping according to the transmitting power of each coding layer, allocate power to the to-be-transmitted symbols of each coding layer respectively, and combine the symbols into one symbol stream.

In some examples of the present application, the layer mapping module 504 may include:

a constellation setting unit, to design a high-order constellation according to the transmitting power of each coding layer, in which each constellation symbol corresponds to a group of joint bit configurations (i.e., joint bit sequences) of a plurality of coding layers;

a first mapping unit, to map data streams of a plurality of coding layers jointly onto a constellation symbol in the high-order constellation; and a high-order modulation unit, to perform high-order constellation modulation to obtain the symbol stream to be transmitted.

In some other examples of the present application, the layer mapping module 504 may include:

a second mapping unit, to map the information bits of the plurality of coding layers jointly onto a constellation symbol in a fixed high-order constellation, and a data stream with a higher priority is mapped onto the bits of a constellation symbol with a higher protection level; and a high-order modulation unit, to perform high-order constellation modulation to obtain the symbol stream to be transmitted.

According to examples of the present application, a transmitting end can perform data coding and modulation using statistical characteristics of interferences without knowing all of the interferences accurately. As such, the data transmission method can be applicable to scenarios where the transmitting end cannot know all of interferences accurately, for example, in an uplink transmission mode based on a Grant-free contention-based mechanism, or scenarios with other contention-based data transmission modes, uncoordinated transmission modes, or scenarios with channel estimation errors, channel estimation delays, or the like.

In addition, in examples of the present application, a transmitting end uses a multi-layer coding structure to adapt to statistical characteristics of interference, i.e., to adapt to the interference through joint power and code rate allocations in multi-layer coding, so as to reduce the outage probability and/or to increase the average data rate. That is, better data transmission performances can be achieved by using the data transmission method of the present application.

It should be understood that in the above processes and structures, not all of the procedures and modules are necessary. Certain procedures or modules may be omitted according to the needs. The order of the procedures is not fixed, and can be adjusted according to the needs. The modules are defined based on function simply for facilitating description. In implementation, a module may be implemented by multiple modules, and functions of multiple modules may be implemented by the same module. The modules may reside in the same device or distribute in different devices.

The block diagrams used in the description of the embodiments show blocks in unit of function. The function blocks (structural units) may be implemented by any combination of hardware and/or software. In addition, the manner of implementing the function blocks is not limited. That is, each function block may be implemented by an apparatus which is physically or logically an integral device, or by multiple devices formed by two or multiple pieces of apparatus physically or logically separated from each other but connected to each other directly or indirectly.

Figure 6:
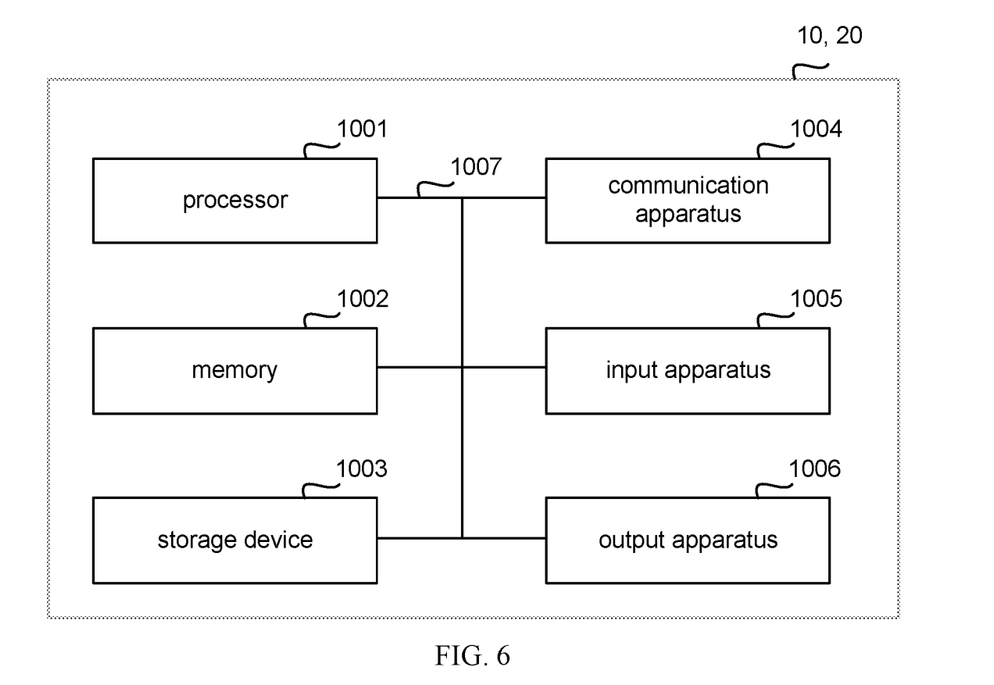
FIG. 6 is a schematic diagram illustrating the hardware structure of a wireless base station and a user terminal according to an example of the present application.

For example, a radio base station, a user terminal, etc., according to an embodiment of the present application may be implemented by a computer carrying out the processes of the wireless communication method of the present disclosure. FIG. 6 is a schematic diagram illustrating a hardware structure of a radio base station and a user terminal according to an example of the present application. The above radio base station 10 and user terminal 20 may be implemented by a computer apparatus which physically includes a processor 1001, a memory 1002, a storage device 1003, a communication apparatus 1004, an input apparatus 1005, an output apparatus 1006 and a bus 1007, or the like.

In addition, in the following description, the term "apparatus" may be replaced by "circuit", "device", "unit", or the like. The hardware structures of the radio base station 10 and the user terminal 20 may include one or multiple pieces of apparatus illustrated in the drawings, or may not include some pieces of the apparatus.

For example, although only one processor 1001 is illustrated, the apparatus may include a plurality of processors. Furthermore, the processing procedures may be implemented by one processor, or by in sequence, or by more than one processors simultaneously, in turn, or in other manners. In addition, the processor 1001 may be implemented by one or multiple chips.

Functions of the radio base station 10 and the user terminal 20 may be implemented by, for example, reading and storing predetermined software (programs) into hardware such as the processor 1001 or the memory 1002, to allow the processor 1001 to do calculations to control communications performed by the communication apparatus 1004, and control the reading and/or writing of data in the memory 1002 and the storage device 1003.

The processor 1001 may control the overall operations of the computer by, for example, running an operating system. The processor 1001 may consist of a central processing unit (CPU) which includes interfaces to peripheral devices, control apparatus, computing apparatus, registers, and so on. For example, a baseband signal processing unit, a call processing unit and the like may be implemented by the processor 1001.

Furthermore, programs (program codes), software modules or data, etc. may be read out from the storage device 1003 and/or the communication apparatus 1004 by the processor 1001 and stored into the memory 1002, based on which the processor 1001 may execute various processes. At least some of the operations in the above embodiments may be implemented as programs executable by a computer. For example, a control unit of the user terminal 20 may be implemented by control programs which are stored in the memory 1002 and function through the processor 1001; other function blocks may be implemented in a similar manner.

The memory 1002 is a computer-readable storage medium, and may be implemented by at least one of, for example, a ROM (Read Only Memory), an EPROM (Erasable Programmable ROM), an EEPROM (Electrically EPROM), a RAM (Random Access Memory) and/or other appropriate storage medium. The memory 1002 may be referred to as "register", "cache", "main memory (primary storage apparatus)", and so on. The memory 1002 may store executable programs (program codes), software modules, or the like, for implementing the radio communication methods of embodiments of the present application.

The storage device 1003 is a computer-readable storage medium, and may be implemented by at least one of, for example, a flexible disk, a floppy (registered trademark) disk, a magneto-optical disk (for example, a compact disc (CD-ROM (Compact Disk ROM), and so on), a digital versatile disc, a Blu-ray (registered trademark) disk), a removable disk, a hard disk driver, a smart card, a flash memory device (for example, a card, a stick, a key driver, etc.), a magnetic stripe, a database, a server, and/or other appropriate storage medium. The storage device 1003 may also be referred to as "secondary storage apparatus".

The communication apparatus 1004 is hardware (transmitting/receiving device) for inter-computer communications through wired and/or wireless networks, and may be referred to as, for example, "network device", "network controller", "network card", "communication module", and so on. The communication apparatus 1004 may include a high frequency switch, a duplexer, a filter, a frequency synthesizer, or the like, to enable, for example, frequency division duplex (FDD) and/or time division duplex (TDD). For example, transmitting/receiving antennas, an amplifying unit, a transmitting/receiving unit, a communication path interface, and so on may be implemented by the communication apparatus 1004.

The input apparatus 1005 is an input device for receiving input from the exterior (for example, a keyboard, a mouse, a microphone, a switch, a button, a sensor, and so on). The output apparatus 1006 is an output device that outputs to the exterior (for example, a display, a speaker, an LED (Light Emitting Diode) lamp, and so on). In addition, the input apparatus 1005 and the output apparatus 1006 may be integrated into one structure (for example, a touch panel).

Furthermore, the apparatus such as the processor 1001, the memory 1002 or the like, may be connected via the bus 1007 for information communication. The bus 1007 may consist of a single bus, or may be formed by different buses between pieces of apparatus.

Also, the radio base station 10 and the user terminal 20 may include hardware such as a microprocessor, a digital signal processor (DSP), an Application-Specific Integrated Circuit (ASIC), a Programmable Logic Device (PLD), and an Field Programmable Gate Array (FPGA), and so on, and part or all of the functional blocks may be implemented by the hardware. For example, the processor 1001 may be implemented by at least one of these hardware devices.

In addition, the terminology used in this specification and the terminology that is needed for understanding this specification may be interchangeable with other terms that convey the same or similar meanings. For example, "channel" and/or "symbol" may be replaced by "signal" (or "signaling"). Also, a "signal" may be a "message". A "Reference signal" may be abbreviated as "RS", and may be referred to as a "pilot", a "pilot signal", or the like, depending on which standard is used. Furthermore, "component carrier" (CC) may be referred to as "cell", "frequency carrier", "carrier frequency", and so on.

Furthermore, a radio frame may be composed of one or multiple periods (frames) in the time domain. Each of the one or multiple periods (frames) forming a radio frame may be referred to as a subframe. Furthermore, a subframe may comprise one or multiple time slots in the time domain. The subframe may have a fixed length of time (e.g., 1 ms) independent of the numerology.

Furthermore, a slot may be formed by one or multiple symbols (Orthogonal Frequency Division Multiplexing (OFDM) symbols, Single Carrier Frequency Division Multiple Access (SC-FDMA) symbols, or the like) in the time domain. Alternatively, a time slot may also be a time unit based on the numerology. In addition, a time slot may also include a plurality of minislots. Each minislot may be formed by one or multiple symbols in the time domain. A minislot may also be referred to as a subslot.

A "radio frame", "subframe", "slot", "minislot" and "symbol" all represent time units in signal transmission. Each of "radio frame", "subframe", "slot", "minislot" and "symbol" may be referred to by other applicable terms. For example, a subframe may also be referred to as a transmission time interval (TTI), a plurality of consecutive subframes may also be referred to as a TTI, and one time slot or one minislot may also be referred to as a TTI. That is, a subframe and/or a TTI may be a subframe (1 ms) in LTE, or may be a period shorter than 1 ms (for example, 1~13 symbols), or may be a period longer than 1 ms. In addition, a unit representing a TTI may also be referred to as a time slot, a minislot, or the like, except a subframe.

Herein, a TTI refers to the smallest time unit for scheduling in radio communications. For example, in LTE systems, a radio base station schedules the allocation of radio resources (such as the frequency bandwidth, transmission power, etc. that can be used by the user terminals) for each user equipment in unit of TTI. In addition, the definition of TTI is not limited to this.

A TTI may be a transmission time unit, e.g., a channel-encoded data packet (transmission block), code block and/or codewords, or may be a processing unit such as scheduling, link adaptation, or the like. In addition, when a TTI is given, a time interval (e.g., the number of symbols) to which a transport block, a code block, and/or a codeword actually is mapped may also be shorter than the TTI.

In addition, when a time slot or a minislot is called a TTI, more than one TTI (i.e., more than one time slot or more than one minislot) may also serve as the smallest time unit for scheduling. Further, the number of slots (the number of minislots) constituting the smallest time unit for scheduling can be controlled.

A TTI of 1 ms may be referred to as a regular TTI (TTI in LTE Rel. 8 to 12), a standard TTI, a long TTI, a regular subframe, a standard subframe, or a long subframe, and so on. A TTI shorter than the regular TTI may be referred to as a compressed TTI, a short TTI, a partial TTI or fractional TTI, a compressed subframe, a short subframe, a minislot, or a subslot, and so on.

In addition, a long TTI (e.g., a regular TTI, a subframe, etc.) may be replaced with a TTI longer than 1 ms, and a short TTI (e.g., a compressed TTI, etc.) may also be replaced with a TTI shorter than a long TTI and longer than 1 ms.

A resource block (RB) is the unit of resource allocation in the time domain and the frequency domain, and may include one or multiple consecutive subcarriers in the frequency domain. In addition, an RB may include one or multiple symbols in the time domain, and may be one time slot, one minislot, one subframe, or one TTI in time length. A TTI and a subframe each may consist of one or multiple RBs. In addition, one or multiple RBs may be referred to as a Physical RB (PRB), a Sub-Carrier Group (SCG), a Resource Element Group (REG), a PRB pair, a RB pair, and so on.

Furthermore, a RB may consist of one or multiple resource elements (REs). For example, a RE may be a radio resource region of one subcarrier and one symbol.

In addition, the above structures of the radio frame, the subframe, the time slot, the minislot, the symbol, etc., are merely examples. For example, configurations, such as the number of subframes included in a radio frame, the number of time slots included in a subframe or a radio frame, the number of minislots included in a time slot, the number of symbols and RBs included in a time slot or a minislot, the number of subcarriers included in an RB, the number of symbols in a TTI, the symbol length and the cyclic prefix (CP) length, etc., may change in various ways.

Further, the information and parameters, etc. described in this specification may be represented by absolute values, or by relative values with respect to predetermined values, or may be represented by other information. For example, radio resources may be indicated by predetermined indices. Further, equations that use those parameters etc. may also be different from those explicitly disclosed in this specification.

The names of the parameters etc. used in this specification are not for limiting the scope in all aspects. For example, the various names assigned to various channels (Physical Uplink Control Channel (PUCCH), Physical Downlink Control Channel (PDCCH), etc.) and information elements are not for limiting the scope in all aspects since these individual channels and information elements can be identified by any suitable names.

The information, signals, etc. described in this specification may be represented by using any of a variety of different technologies. For example, the data, commands, instructions, information, signals, bits, symbols and chips, etc., all of which may be mentioned throughout the description, may be represented by voltages, currents, electromagnetic waves, magnetic fields or particles, optical fields or photons, or any combination of these.

Also, the information, signals, etc. may be output from higher layers to lower layers and/or from lower layers to higher layers. The information, signals, etc. may be inputted and outputted via a plurality of network nodes.

Input and/or output information, signals, etc. may be stored in a specific location (for example, a memory), or may be managed using a management table. Input and/or output information, signals, etc. may be overwritten, updated or appended. Output information, signals, etc. may be deleted. Input information, signals, etc. may be transmitted to another device.

Communication of information is not limited to the aspects/embodiments described in this specification, and may use other methods as well. For example, communication of information may be implemented using physical layer signaling (for example, downlink control information (DCI), uplink control information (UCI), higher layer signaling (for example, Radio Resource Control (RRC) signaling, broadcast information (the master information block (MIB), system information blocks (SIBS) and so on), Medium Access Control (MAC) signaling and so on), and other signals and/or combinations thereof.

In addition, the physical layer signaling may be referred to as L1/L2 (Layer 1/Layer 2) control information (L1/L2 control signals), and so on. RRC signaling may be referred to as a RRC message, and may be, for example, an RRC connection setup message, an RRC connection reconfiguration message, and so on. Also, MAC signaling may be communicated using, for example, MAC control elements (MAC CEs).

Besides, predetermined information (for example, reporting "being X") is not necessarily signaled explicitly, and may be signaled implicitly (by, for example, not communicating the predetermined information or by communicating other information).

Decisions may be made using a value represented by one bit (0 or 1), or using a Boolean value represented by true or false, or may be made by comparing numerical values (for example, through comparison with a predetermined value).

Software, whether it is referred to as "software", "firmware", "middleware", "microcode", or "hardware description language", or called by other names, should be interpreted broadly, to mean instructions, instruction sets, codes, code segments, program codes, programs, subprograms, software modules, applications, software applications, software packages, routines, subroutines, objects, executable files, execution threads, procedures, functions, and so on.

Also, software, commands, information, and so on may be transmitted and received via communication media. For example, when software is transmitted from a website, a server or other remote sources by using wired technologies (coaxial cables, optical fiber cables, twisted-pair cables, digital subscriber lines (DSL), and so on) and/or wireless technologies (infrared radiation, microwaves, and so on), these wired technologies and/or wireless technologies are also included in the definition of communication media.

The terms "system" and "network" as used herein are used interchangeably.

As used herein, the terms "base station (BS)", "radio base station", "eNB", "cell", "sector", "cell group", "carrier", and "component carrier" may be used interchangeably. A base station may be referred to as a "fixed station", "NodeB", "eNodeB (eNB)", "access point", "transmission point", "receiving point", "femto cell", "small cell", and so on.

A base station can accommodate one or more (for example, three) cells (also referred to as "sectors"). When a base station accommodates a plurality of cells, the entire coverage area of the base station may be partitioned into multiple smaller areas, and each smaller area may provide communication services through base station subsystems (for example, indoor small base stations (RRHs (Remote Radio Heads))). The term "cell" or "sector" refers to part or all of the coverage area of a base station and/or a base station subsystem that provides communication services within this coverage.

As used herein, the terms "mobile station (MS)", "user terminal", "user equipment (UE)" and "equipment" may be used interchangeably. A base station may be referred to as a "fixed station", "NodeB", "eNodeB (eNB)", "access point", "transmission point", "receiving point", "femto cell", "small cell", and so on.

"Mobile station" may be referred to, by a person skilled in the art, as "subscriber station", "mobile unit", "subscriber unit", "wireless unit", "remote unit", "mobile device", "wireless device", "wireless communication device", "remote device", "mobile subscriber station", "access equipment", "mobile equipment", "wireless equipment", "remote equipment", "handset", "user agent", "mobile client", "client" or some other suitable terms.

Furthermore, the radio base stations in this specification may be interpreted as user terminals. For example, each aspect/embodiment of the present disclosure may be applied to a configuration in which communications between a radio base station and a user terminal are replaced with communications between a plurality of user terminals (D2D (Device-to-Device)). In this case, the user terminal 20 may have the functions of the radio base station 10 described above. In addition, wording such as "uplink" and "downlink" may be interpreted as "side". For example, an uplink channel may be interpreted as a side channel.

Likewise, the user terminals in this specification may be interpreted as radio base stations. In this case, the radio base station 10 may have the functions of the user terminal 20 described above.

Certain actions which have been described in this specification to be performed by base stations may, in some cases, be performed by upper nodes. In a network consisting of one or more network nodes with base stations, it is clear that various operations that are performed to communicate with the user equipments can be performed by base stations, one or more network nodes (for example, MMEs (Mobility Management Entities), S-GW (Serving-Gateways), and so on may be possible, but these are not limiting) other than base stations, or combinations of these.

The aspects/embodiments illustrated in this specification may be used individually or in combinations, which may be switched depending on the mode of implementation. The order of processes, sequences, flowcharts, and so on that have been used to describe the aspects/embodiments herein may be re-ordered as long as inconsistencies do not arise. For example, although various methods have been illustrated in this specification with various components of steps in exemplary orders, the specific orders that are illustrated herein are by no means limiting.

The aspects/embodiments illustrated in this specification may be applied to systems that use LTE (Long Term Evolution), LTE-A (LTE-Advanced), LTE-B (LTE-Beyond), SUPER 3G, IMT-Advanced, 4G (4th generation mobile communication system), 5G (5th generation mobile communication system), FRA (Future Radio Access), New-RAT (Radio Access Technology), NR(New Radio), NX (New radio access), FX (Future generation radio access), GSM (registered trademark) (Global System for Mobile communications), CDMA 2000, UMB (Ultra Mobile Broadband), IEEE 802.11 (Wi-Fi (registered trademark)), IEEE 802.16 (WiMAX (registered trademark)), IEEE 802.20, UWB (Ultra-WideBand), Bluetooth (registered trademark), systems that use other adequate radio communication methods, and/or next-generation systems that are enhanced based on these.

The phrase "based on" as used in this specification does not mean "based only on", unless otherwise specified. In other words, the phrase "based on" means both "based only on" and "based at least on".

Reference to elements with designations such as "first", "second", and so on as used herein does not generally limit the number/quantity or order of these elements. These designations are used herein only for convenience, as a method of distinguishing between two or more elements. In this way, reference to the first and second elements does not imply that only two elements may be employed, or that the first element must precede the second element in some way.

The term "determining" as used herein may encompass a wide variety of actions. For example, to "determining" as used herein may be interpreted to mean making determinations related to calculating, computing, processing, deriving, investigating, looking up (for example, searching a table, a database or some other data structure), ascertaining, and so on. Furthermore, to "determining" as used herein may be interpreted to mean making determinations related to receiving (for example, receiving information), transmitting (for example, transmitting information), inputting, outputting, accessing (for example, accessing data in a memory), and so on. In addition, to "determining" as used herein may be interpreted to mean making determinations related to resolving, selecting, choosing, establishing, comparing, and so on. That is, "determining" as used herein may be interpreted to mean making determinations related to some actions.

As used herein, the terms "connected" and "coupled", or any variation of these terms, mean all direct or indirect connections or coupling between two or more elements, and may include the presence of one or more intermediate elements between two elements that are "connected" or "coupled" to each other. The coupling or connection between the elements may be physical, logical or a combination of these. For example, "connection" may be interpreted as "access. As used herein, two elements may be considered "connected" or "coupled" to each other by using one or more electrical wires, cables and/or printed electrical connections, and, in a number of non-limiting and non-inclusive examples, by using electromagnetic energy such as electromagnetic energy having wavelengths in the radio frequency, microwave and/or optical regions (both visible and invisible).

When terms such as "including", "comprising" and variations of these are used in this specification or in claims, these terms are intended to be inclusive, in a manner similar to the way the term "provide" is used. Furthermore, the term "or" as used in this specification or in claims is intended to be not an exclusive disjunction.

Although the present disclosure has been described in detail above, it should be obvious to a person skilled in the art that the present disclosure is by no means limited to the embodiments described herein. The present disclosure can be implemented with various corrections and in various modifications, without departing from the spirit and scope of the present disclosure defined by the recitations of claims. Therefore, the description herein is provided only for the purpose of explaining examples, and should by no means be construed to limit the present disclosure in any way

The invention claimed is:

1. A data transmission method, comprising:
obtaining statistical characteristics of interferences in a channel in which transmission is to be performed;
determining a total number of coding layers of a multi-layer coding scheme to be used for the transmission, a code rate and a transmitting power of each coding layer of the coding layers which make an indicator of transmission performance in the channel satisfies a predefined requirement under interferences having the statistical characteristics; mapping to-be-transmitted information bits onto the coding layers whose number equals the determined total number by mapping each of a plurality of subsets of the information bits onto each of the coding layers according to importance levels of the subsets and transmission capabilities of the coding layers; for each coding layer, coding a subset of the information bits mapped onto the coding layer to obtain a coded data stream of the coding layer having a code rate determined for the coding layer;
processing the coded data stream of each coding layer through layer mapping and modulation according to the determined transmitting power of each coding layer to obtain a symbol stream to be transmitted; and
transmitting the symbol stream via the channel.

2. The method of claim 1, wherein obtaining the statistical characteristics of the interferences comprises: pre-determining a statistical distribution model of the interferences in a channel, and estimating the statistical characteristics of the interferences according to channel related information and the predetermined statistical distribution model of the interferences in the channel.

3. The data transmission method of claim 1, wherein obtaining the statistical characteristics of the interferences comprises: obtaining the statistical characteristics of interferences by analyzing probability density distributions of a total number and positions of users simultaneously performing transmission in the channel and a total transmitting power in the channel according to a traffic model, a transmitting power model and a position distribution model of users.

4. The method of claim 1, wherein obtaining the statistical characteristics of the interferences comprises:
   establishing a machine learning model which takes instantaneous interferences obtained each time as input and takes statistical distribution of the interferences as output; and
   continuously updating the machine learning model according to the instantaneous interferences, and obtaining the statistical characteristics of the interferences when output of the machine learning model converges.

5. The data transmission method of claim 1, wherein determining the total number of coding layers of the multi-layer coding scheme to be used for the transmission, the code rate and the transmitting power of each coding layer of the coding layers comprises:
   pre-defining a maximum number $L_M$ of coding layers of the multi-layer coding;
   calculating an average transmission data rate of a transmitting device and a corresponding code rate and transmitting power of each coding layer when the average transmission data rate of the transmitting device reaches a maximum value in each multi-layer coding scheme whose total number of coding layers ranges from 1 to the maximum number $L_M$, to obtain $L_M$ groups of maximum values of the average transmission data rates of the transmitting device and corresponding code rate and transmitting power of each coding layer; and
   identifying a maximum value from the $L_M$ groups of maximum values of the average transmission data rates of the transmitting device and corresponding code rate and transmitting power of each coding layer, determining a total number L of coding layers corresponding to the maximum value as the total number of the coding layers of the multi-layer coding, and determining a code rate {RL} and transmitting power {PL} of each coding layer which make the average transmission data rate of the transmitting device reach the maximum value when the total number of coding layers of the multi-layer coding is L as the code rate and the transmitting power of each coding layer of the multi-layer coding.

6. The data transmission method of claim 5, wherein calculating an average transmission data rate of a transmitting device and a corresponding code rate and transmitting power of each coding layer when the average transmission data rate of the transmitting device reaches a maximum value in each multi-layer coding comprises:
   after the L is determined, maximizing the following expression which represents the maximum value of the average transmission data rate of the transmitting device, to determine $\lambda_i$ and $R_1$:

$$\max_{\lambda_i, R_i, i=1 \ldots L} \int M(1, \lambda_i, R_i, i = 1 \ldots L, Rx) f(I) dI$$

wherein I is the average power of interferences, f(I) is the statistical distribution of the average power of the interferences; $M(I, \lambda_i, R_i, i=1 \ldots L, Rx)$ is a revenue function, in which $\lambda_i$ is a power allocation factor of the i-th coding layer, $R_i$ is the code rate of the i-th coding layer, $M(I, \lambda_i, R_i, i=1 \ldots L, Rx)$ is a revenue obtained when each coding layer adopts the power allocation factor $\lambda_i$ and the code rate configuration $R_1$ given a receiving strategy Rx and interference I.

7. The data transmission method of claim 6, wherein the receiving strategy Rx is serial interference cancellation (SIC) reception for each coding layer, a revenue target is instantaneous capacity of reliable transmission of data at the transmitting end, and the revenue function is obtained by:

$$M(1, \lambda_i, R_i, i = 1 \ldots L) = \sum_{i=1}^{L} \left( \Theta \left( \log \left( 1 + \left( P*|\lambda_i|^2 / N + I + P* \sum_{j=i+1}^{L} |\lambda_j|^2 \right) \right) > R_i \right) * R_i \right)$$

wherein L is the total number of coding layers of the multi-layer coding; $\Sigma_{i=1}^{L}|\lambda_i|^2=1$; P is a transmitting power of a transmitting device; N is noise power; $\Theta(\cdot)$ is a characteristic function, when the expression in the parentheses is true, the value of the function is 1, and otherwise, the value is 0.

8. The data transmission method of claim 1, wherein mapping the to-be-transmitted information bits onto the coding layers comprises:
   determining levels of L coding layers;
   determining priorities of the to-be-transmitted data streams according to importance degrees of the to-be-transmitted data streams; and
   dividing the to-be-transmitted data streams into L data stream groups according to the total number of coding layers of the multi-layer coding, the levels, code rates and the priorities of the to-be-transmitted data streams, and map the L data stream groups to the L coding layers.

9. The data transmission method of claim 8, further comprising: after mapping the L data stream groups to the L coding layers, incorporating into a to-be-transmitted data stream of each coding layer, a to-be-transmitted data stream of another coding layer with a higher level than the coding layer, and performing systematic coding.

10. The data transmission method of claim 1, wherein for each coding layer, coding a subset of the information bits mapped onto the coding layer to obtain a coded data stream of the coding layer having a code rate determined for the coding layer comprises: after obtaining the subset of the information bits of each coding layer and the code rate of each coding layer, coding the subset of the information bits of each coding layer respectively using single-layer coding to obtain the coded data stream of each coding layer.

11. The method of claim 1, wherein processing the coded data stream of each coding layer through layer mapping and the modulation according to the determined transmitting power of each coding layer to obtain a symbol stream to be transmitted comprises:
   processing the coded data stream of each coding layer through constellation modulation to obtain a to-be-transmitted symbol stream of each coding layer; and
   performing layer mapping according to the transmitting power of each coding layer, allocating power to the to-be-transmitted symbols of each coding layer respectively, and combining the symbols into one symbol stream.

12. The method of claim 11, wherein the layer mapping is performed according to:

$$x^t = \Sigma_{l=1}^{L} \lambda_l^t x_l^t e^{j \vartheta_l^t}, x^t \in \chi^t(\lambda^t, \vartheta^t)$$

wherein $x_l^t$ is the modulated l-th symbol stream; $\lambda_l^t$ is the transmitting power allocation factor of the l-th coding layer; $\vartheta_l^t$ is the rotation angle of the constellation of the l-th coding layer; and $\chi^t(\lambda^t,\vartheta^t)$ represents a composite constellation determined using parameter configuration in the parentheses.

13. The method of claim 12, wherein the rotation angle $\vartheta_l^t$ is set to be 0 or determined by solving the following optimization problem:

$$\text{argmax}(\text{metric}(\vartheta^t));$$

$$\text{metric}(\vartheta^t) = \sum_{x_1 \in \chi^t(\lambda^t,\vartheta^t)} \log\left[\sum_{x_2 \in \chi^t(\lambda^t,\vartheta^t)} \frac{1}{|\chi^t(\lambda^t,\vartheta^t)|^2} \exp\left(-\frac{1}{4\sigma^2}\|x_1 - x_x\|^2\right)\right]$$

wherein $x_1$ is a point in the composite constellation of a receiving device; $x_2$ is a point in the composite constellation of the receiving device; and $\sigma^2$ represents noise variance; $\chi^t(\lambda^t,\vartheta^t)$ represents a composite constellation of the receiving device obtained using parameter configuration in the parentheses.

14. The method of claim 1, wherein processing the coded data stream of each coding layer through layer mapping and modulation according to the determined transmitting power of each coding layer to obtain a symbol stream to be transmitted comprises:
    designing a high-order constellation according to the transmitting power of each coding layer, in which each constellation symbol is corresponding to a group of joint bit sequences of a plurality of coding layers;
    mapping information bits of the plurality of coding layers jointly onto a constellation symbol in the high-order constellation; and
    performing high-order constellation modulation to obtain the to-be-transmitted symbol stream.

15. The method of claim 1, wherein processing the coded data stream of each coding layer through layer mapping and modulation according to the determined transmitting power of each coding layer to obtain a symbol stream to be transmitted comprises:
    mapping information bits of a plurality of coding layers jointly onto a constellation symbol in a fixed high-order constellation, information bits with a higher priority are mapped onto a bit of a constellation symbol with a higher protection level; and
    performing high-order constellation modulation to obtain the to-be-transmitted symbol stream.

16. A computer-readable storage medium, storing computer-readable instructions executable by a processor to perform the method of claim 1.

17. A data transmission apparatus, comprising:
    a processor;
    a memory coupled to the processor; the memory stores machine-readable instructions executable by the processor to:
    obtain statistical characteristics of interferences in a channel in which transmission is to be performed;
    determine a total number of coding layers of a multi-layer coding scheme to be used for the transmission, a code rate and a transmitting power of each coding layer of the coding layers which make an indicator of transmission performance in the channel satisfies a pre-defined requirement under interferences having the statistical characteristics;
    map to-be-transmitted information bits onto the coding layers whose number equals the determined total number by mapping each of a plurality of subsets of the information bits onto each of the coding layers according to importance levels of the subsets and transmission capabilities of the coding layers;
    for each coding layer, code a subset of the information bits mapped onto the coding layer to obtain a coded data stream of the coding layer having a code rate determined for the coding layer;
    process the coded data stream of each coding layer through layer mapping and modulation according to the determined transmitting power of each coding layer to obtain a symbol stream to be transmitted; and
    transmit the symbol stream to be transmitted via the channel.

18. The data transmission apparatus of claim 17, wherein the instructions are executable by the processor to:
    pre-define a maximum number LM of coding layers of the multi-layer coding;
    calculate an average transmission data rate of a transmitting device and a code rate and transmitting power of each coding layer when the average transmission data rate of the transmitting device reaches a maximum value in each multi-layer coding whose total number of coding layers ranges from 1 to the maximum layer number LM, to obtain LM groups of maximum values of average transmission data rates of the transmitting device and corresponding code rate and transmitting power of each coding layer; and
    identify a maximum value from the LM groups of maximum values of the average transmission data rates of the transmitting device and corresponding code rate and transmitting power of each coding layer, determine a total number L of coding layers corresponding to the maximum value as the total number of coding layers of the multi-layer coding, and determine a code rate {RL} and transmitting power {PL} of each coding layer which make the average transmission data rate of the transmitting device reach the maximum value when the total number of coding layers of the multi-layer coding is L as the code rate and the transmitting power of each coding layer of the multi-layer coding.

19. The data transmission apparatus of claim 17, wherein the instructions are executable by the processor to:
    determine levels of the L coding layers;
    determine priorities of to-be-transmitted data streams according to importance degrees of the to-be-transmitted data streams; and
    divide to-be-transmitted data streams into L data stream groups according to the total number of coding layers of the multi-layer coding, levels, code rates and the priorities of the to-be-transmitted data streams, and map the L data stream groups to the L coding layers.

20. The data transmission apparatus of claim 17, wherein the instructions are executable by the processor to:
    process the coded data stream of each coding layer through constellation modulation to obtain a to-be-transmitted symbol stream of each coding layer; and
    perform layer mapping according to the transmitting power of each coding layer, allocate power to the to-be-transmitted symbols of each coding layer respectively, and combine the symbols into one symbol stream.

* * * * *